United States Patent [19]

Kurosawa

[11] Patent Number: 5,748,016

[45] Date of Patent: May 5, 1998

[54] DRIVER CIRCUIT

[75] Inventor: Susumu Kurosawa, Tokyo, Japan

[73] Assignee: NEC Corporation, Tokyo, Japan

[21] Appl. No.: 618,778

[22] Filed: Mar. 20, 1996

[30] Foreign Application Priority Data

Mar. 22, 1995 [JP] Japan ..................... 7-062339

[51] Int. Cl.$^6$ ............... H03K 19/003; H03K 19/0185
[52] U.S. Cl. ............ 327/108; 327/387; 327/391; 327/534; 326/31; 326/34; 326/27
[58] Field of Search ................. 327/108, 112, 327/379, 387, 389, 391, 534; 326/22–24, 31, 34, 23, 27

[56] References Cited

U.S. PATENT DOCUMENTS

| | | | |
|---|---|---|---|
| 5,157,279 | 10/1992 | Lee ........................... | 326/34 |
| 5,191,244 | 3/1993 | Runaldue et al. ............. | 326/33 |
| 5,532,617 | 7/1996 | Parkinson et al. ........... | 326/33 |
| 5,543,734 | 8/1996 | Volk et al. .................. | 326/34 |
| 5,559,461 | 9/1996 | Yamashina et al. .......... | 327/205 |
| 5,565,795 | 10/1996 | Kawano ....................... | 326/34 |
| 5,574,389 | 11/1996 | Chu ............................ | 326/33 |

FOREIGN PATENT DOCUMENTS 4-138719  5/1992  Japan ..................... 326/34

OTHER PUBLICATIONS

Suzuki et al., "A High-Speed BiCMOS Gate Array Using BiCMOS Gate Circuit Featured By Darlington Buffer", *The Transaction of the Institute of Electronics, Information And Communication Engineers*, vol. J73-C-11, No. 12, pp. 867–875, (1990).

Parke et al., "Bipolar–FET Hybrid–Mode Operation of Quarter–Micrometer SOI MOSFET's", *IEEE Electron Device Letters*, vol. 14(5):234–236, (1993).

Primary Examiner—Timothy P. Callahan
Assistant Examiner—T. T. Lam
Attorney, Agent, or Firm—Foley & Lardner

[57] ABSTRACT

A driver circuit comprising (i) a pair of complementary MOS (CMOS) transistors connected in series and receiving an identical input signal, and (ii) a pair of control transistors changing a threshold voltage state of each of the pair of CMOS transistors by applying a plurality of voltages to a body terminal of each of the pair of CMOS transistors depending upon the ON/OFF state of each of the pair of CMOS transistors. Such a driver circuit is capable of reconciling a high-speed operation with a low power consumption under low power supply voltage conditions.

11 Claims, 5 Drawing Sheets

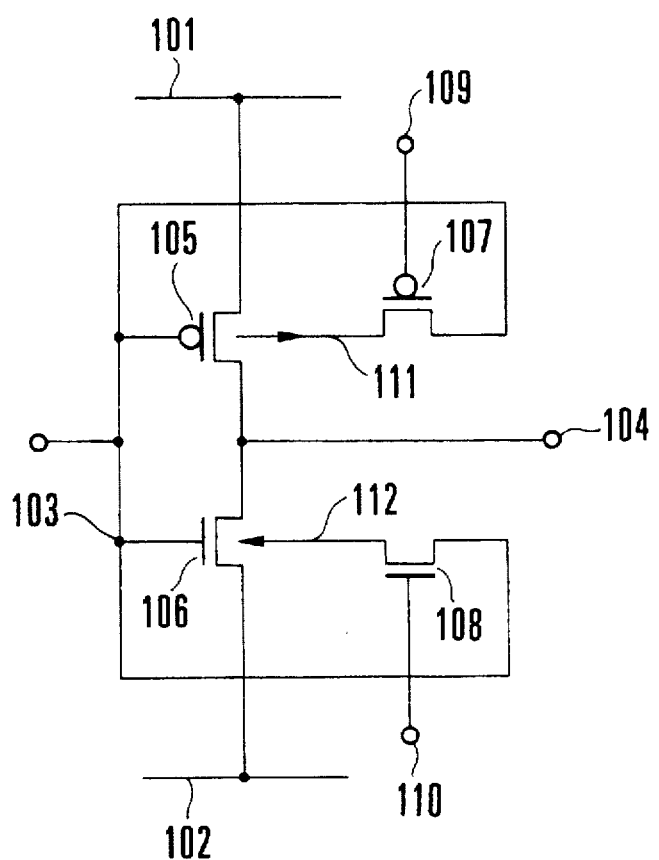
F I G. 1

DRIVER CIRCUIT

BACKGROUND OF THE INVENTION

The present invention relates to a driver circuit and, more particularly, to a driver circuit including a complementary MOSFET (Metal Oxide Semiconductor Field Effect Transistor).

Each circuit constituting a semiconductor integrated circuit (to be referred to as an LSI hereinafter) must have a logical function and a capability of driving a load capacitance. A load capacitance consists of an input capacitance and a wiring capacitance at the next stage connected to the output, and there are a variety of structures. Generally, the complexity of the logical function is inconsistent with the driving capability. When a large load capacitance is to be driven at a high speed, a circuit called a driver having a simple logical function and a large driving capability is used.

Many logical LSIs use CMOS circuits, and in many cases, an inverter circuit consisting of a MOSFET having a large channel width is used as a driver circuit.

A composite circuit structure called a Bi-CMOS circuit which combines the low power consumption properties of a CMOS circuit and the high load driving capability of a bipolar transistor is well known. A lot of circuit structures have been proposed, and as an example, FIG. 5 shows a complementary BI-CMOS circuit of a grounded-emitter type.

Referring to FIG. 5, a well-known CMOS inverter circuit is constituted by a p-channel MOSFET 5 and an n-channel MOSFET 6. An input terminal 3 is connected to the gate terminals of the FETs 5 and 6.

The p-channel MOSFET 5 is connected to a power line 1 through a resistor 29. The n-channel MOSFET 6 is connected to a ground line 2 through a resistor 30. Reference numeral 4 denotes an output terminal.

This circuit has a pnp bipolar transistor 25 and an npn bipolar transistor 26, so that high-speed charge/discharge of the output terminal can be performed.

With this arrangement, when an input signal supplied to the input terminal 3 changes from low level to high level, the n-channel MOSFET 6 is turned on to supply a current to the base electrode of the npn-type bipolar transistor 26. The bipolar transistor 26 is turned on to perform high-speed discharge to the output terminal. In this circuit arrangement, to extract electric charges from the base of the bipolar transistor upon completion of the discharge (charge) operation to turn off the bipolar transistor, and to cause full swing of an output voltage from the power supply voltage to the ground voltage, the resistors 29 and 30 are arranged between the base terminals and the ground line (power line).

In the Bi-CMOS circuit, an arbitrary logical function can be formed by a MOSFET group. However, the characteristic feature cannot be maximized when the logical function is made so complex. The Bi-CMOS technology has a disadvantage such that the manufacturing processes are complex, and a large number of elements are required. However, when this technology is used to manufacture a driver circuit for only a large load capacitance portion while reconciling the driver circuit and a CMOS circuit, a high-performance logical LSI can be realized.

Recently, a structure wherein an insulating film or an insulating layer is formed on a semiconductor substrate, and a semiconductor film or a semiconductor layer having a transistor and the like is formed on the resultant structure, i.e., an SOI (Silicon On Insulator) structure has been extensively studied and developed. The SOI structure has many characteristics as compared to a conventional structure wherein a transistor is directly formed on a semiconductor substrate (to be referred to as a bulk structure hereinafter). For example, in a MOSFET, a diffusion layer is surrounded by an insulating film. Therefore, the capacitance of a source or drain is decreased to ⅕ to ¹⁄₁₀ that of the bulk structure.

When terminals are formed to independently supply a potential to MOSFET bodies, a bipolar transistor with a lateral structure wherein the source serves as an emitter, the body serves as a base, and the drain serves as a collector can be easily formed. Both an npn transistor and a pnp transistor can be formed without any special process, so that the above-described complementary Bi-CMOS circuit can be easily realized. Such a complementary Bi-CMOS circuit can also be formed with the bulk structure. However, wells must be individually formed for the MOSFETs, resulting in a large degradation in efficiency associated with the area.

However, in the driver circuit of the above-mentioned conventional CMOS circuit or Bi-CMOS circuit, when the power supply voltage is decreased to lower the power consumption, the operation speed largely decreases.

In the conventional CMOS circuit, when the threshold value (Vth) of the MOSFET is lowered, the decrease in operation speed can be suppressed. However, even when the MOSFET is in an OFF state, a subthreshold current in a significant amount flows, so the power consumption cannot be neglected even in the OFF state of the circuit. For this reason, the threshold voltage of the MOSFET cannot be simply lowered.

In the conventional Bi-CMOS circuit, to turn on the bipolar transistor, a voltage at a predetermined level or more (e.g., 0.8 [V]) must be applied between the base and the emitter. Since the source electrode of the MOSFET for supplying a current to the base of the bipolar transistor is connected to the base electrode, the maximum value of the voltage applied between the gate and the source corresponds to a value obtained by subtracting the above voltage (e.g., 0.8 [V]) from the power supply voltage. For this reason, when the power supply voltage is lowered, the current supply capability of the MOSFET abruptly degrades to result in a large decrease in operation speed.

Both the bulk structure and the SOI structure have this problem. In addition, both the vertical and lateral bipolar transistors have the same problem.

SUMMARY OF THE INVENTION

It is an object of the present invention to provide a driver circuit capable of reconciling a high-speed operation and a low power consumption under a low power supply voltage.

In order to achieve the above object, according to the present invention, there is provided a driver circuit including a pair of complementary MOS transistors which are connected in series and receive an identical input signal, comprising a pair of control transistors for applying a first voltage for setting the transistor in a low threshold voltage state to a body terminal of the transistor in an ON state of the MOS transistor, and applying a second voltage for setting the transistor in a high threshold voltage state to the body terminal of the transistor in an OFF state of the MOS transistor.

BRIEF DESCRIPTION OF THE DRAWINGS

FIG. 1 is a circuit diagram showing the arrangement of a driver circuit according to the first embodiment of the present invention;

FIGS. 4A to 4C are views schematically showing an n-channel MOSFET formed by the SOI technology, in which FIG. 4A shows a plan view, FIG. 4B shows a sectional view taken along a line B1-B2 in FIG. 4A, and FIG. 4C shows a sectional view taken along a line C1-C2 in FIG. 4A.

DESCRIPTION OF THE PREFERRED EMBODIMENTS

The present invention will be described below with reference to the accompanying drawings.

FIG. 1 shows the arrangement of a driver circuit according to the first embodiment of the present invention. Referring to FIG. 1, a well-known inverter circuit is constituted by a p-channel MOSFET 105 and an n-channel MOSFET 106. The sources of MOSFETs 107 and 108 having the same conductivity types as those of the MOSFETs 105 and 106, respectively, are connected to body terminals 111 and 112 of the MOSFETs 105 and 106 constituting the inverter circuit.

More specifically, the source of the p-channel MOSFET 107 is connected to the body terminal 111 of the p-channel MOSFET 105. The drain of the MOSFET 107 is connected to the gate of the MOSFET 105. The source of the n-channel MOSFET 108 is connected to the body terminal 112 of the n-channel MOSFET 106. The drain of the MOSFET 108 is connected to the gate of the MOSFET 106.

An input signal from an input terminal 103 is directly applied to the gates of the MOSFETs 105 and 106 and simultaneously applied to the body terminals 111 and 112 of the MOSFETs 105 and 106 through the MOSFETs 107 and 108, respectively.

In the driver circuit of this embodiment, when the MOSFETs 105 and 106 are in an OFF state, the body voltage is equal to the source voltage. In an ON state, a forward bias state is set. When the body voltage forward-biases the source, the absolute value of the threshold voltage of the MOSFET decreases to result in an increase in drain current.

However, when the p-n junction formed by the body and the source is largely forward-biased, a large current flows through the p-n junction. In this case, the driver circuit cannot be sufficiently driven at the front stage, and a large DC current continues to flow. Therefore, the forward bias voltage must be limited to about 0.5 [V] or below. This limitation is realized by using a fact that, when the MOSFETs 107 and 108 are operated such that an output is extracted from the source (to be referred to as a source follower operation hereinafter), the source voltage never increases beyond a value obtained by subtracting the threshold value from the gate voltage.

Figure 2:
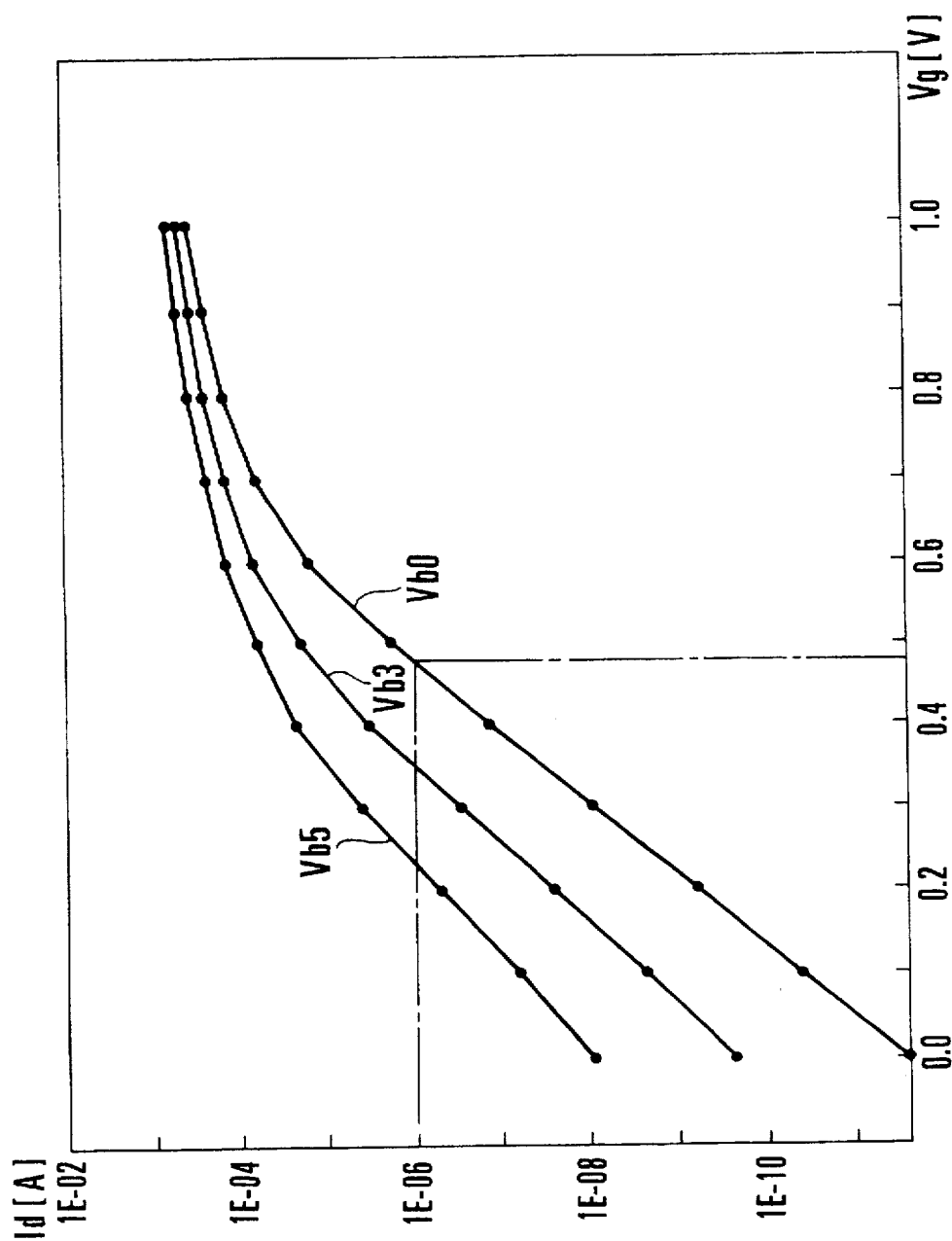
FIG. 2 is a graph showing the I-V characteristics of a typical MOSFET.

The power consumption in an OFF state of this circuit is substantially determined by the subthreshold current of the MOSFET in an OFF state. FIG. 2 shows the I-V characteristics of a typical n-channel MOSFET. To obtain a current of about 1 [pA], the threshold voltage must not be lowered beyond about 0.5 [V].

More specifically, in FIG. 2, a drain current Id [A] is plotted along the ordinate, and a gate voltage Vg [V] is plotted along the abscissa. Characteristics (Vb0) obtained when the forward bias voltage Vb between the body and the source is 0.0 [V], characteristics (Vb3) obtained when Vb=0.3 [V], and characteristics (Vb5) obtained when Vb=0.5 [V] are shown.

Of these characteristics, consider the characteristics at the bias voltage Vb=0.0 [V]. When the drain current Id is 1 [μA] (1E-06), the gate voltage Vg is almost 0.5 [V] (indicated by a chain line).

Assume that the threshold voltage of the MOSFET is set at ±0.5 [V]. To limit the forward bias state of the p-n junction formed by the body and the source of the MOSFET 105 to 0.5 [V], the voltage of a gate terminal 109 of the MOSFET 107 is set to 0.0 [V]. Similarly, to limit the forward bias state of the p-n junction formed by the body and the source of the MOSFET 106 to 0.5 [V], the voltage of a gate terminal 110 of the MOSFET 108 is set to 1.0 [V]. As a result, a power supply voltage of 1.0 [V] can be conveniently used.

The operation of the driver circuit shown in FIG. 1 will be described below in detail. Assume that the voltage of the input terminal 103 is 0.0 [V]. At this time, the voltage of the body terminal 112 of the MOSFET 106 in an OFF state is 0.0 [V] through the MOSFET 108 and is in a high threshold state. On the other hand, the voltage of the body terminal 111 of the MOSFET 105 is almost 0.5 [V] as a result of the source follower operation of the MOSFET 107 and is in a low threshold state.

Assume that the voltage of the input terminal 103 changes from 0.0 [V] to 1.0 [V]. The voltage of the body terminal 112 of the MOSFET 106 which should be turned on becomes almost 0.5 [V] upon the source follower operation of the MOSFET 108, so that a low threshold state is set to obtain a large driving current. On the other hand, the voltage of the body terminal 111 of the MOSFET 105 which should be turned off becomes almost 1.0 [V] through the MOSFET 107, and a high threshold state is set.

Assume that the voltage of the input terminal 103 changes from 1.0 [V] to 0.0 [V]. The voltage of the body terminal 111 of the MOSFET 105 which should be turned on becomes almost 0.5 [V] upon the source follower operation of the MOSFET 107, so that a low threshold state is set to obtain a large driving current. On the other hand, the voltage of the body terminal 112 of the MOSFET 106 which should be turned off becomes almost 0.0 [V] through the MOSFET 108, and a high threshold state is set.

That is, in this embodiment, when the n-channel MOSFET 106 is to be set in a low threshold state, an intermediate voltage value between the power supply voltage value and the ground voltage value is applied to the body terminal 112. When the MOSFET 106 is to be set in a high threshold state, almost the same voltage value as the ground voltage value is applied to the body terminal 112.

In this embodiment, when the p-channel MOSFET 105 is to be set in a low threshold state, an intermediate voltage value between the power supply voltage value and the ground voltage value is applied to the body terminal 111. When the MOSFET 105 is to be set in a high threshold state, almost the same voltage value as the power supply voltage value is applied to the body terminal 111.

The MOSFETs 107 and 108 only charge/discharge the bodies of the MOSFETs 105 and 106, respectively, so no large channel width is required. In addition, the bodies of the MOSFET 107 and 108 may be biased to a predetermined voltage or set in a floating state.

Figure 3A:
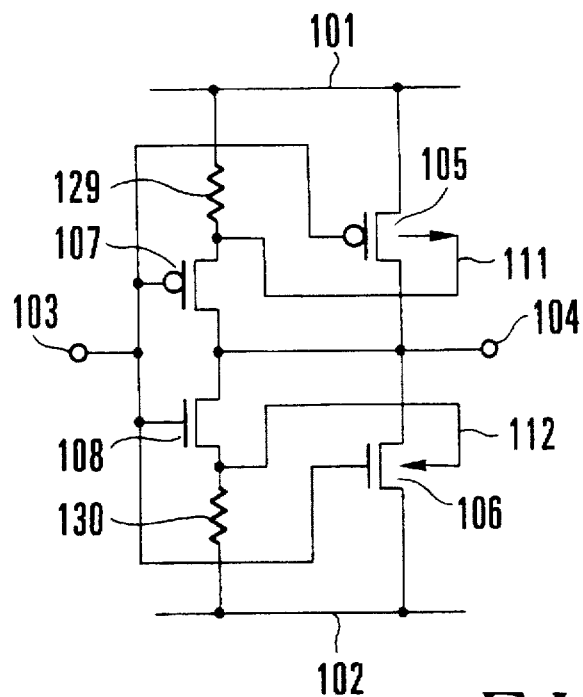
FIG. 3A is a circuit diagram showing the arrangement of a driver circuit according to the second embodiment of the present invention.

FIG. 3A shows the arrangement of the second embodiment of the present invention. The same reference numerals as in FIG. 1 denote the same parts in FIG. 3A. Referring to FIG. 3A, a well-known inverter circuit is constituted by a p-channel MOSFET 105 and an n-channel MOSFET 106. The source electrode terminals of MOSFETs 107 and 108 having the same conductivity types as those of the MOSFETs 105 and 106 constituting the inverter circuit are connected to body terminals 111 and 112 of the MOSFETs 105 and 106, respectively.

More specifically, the source electrode terminal of the p-channel MOSFET 107 is connected to the body terminal 111 of the p-channel MOSFET 105. The source electrode terminal of the n-channel MOSFET 108 is connected to the body terminal 112 of the n-channel MOSFET 106. That is, the body terminals 111 and 112 of the MOSFETs 105 and 106 are controlled by the MOSFETs 107 and 108.

Unlike in FIG. 1, the source electrode terminal of the MOSFET 107 is connected to a power line 101 through a resistor 129, and the source electrode terminal of the MOSFET 108 is connected to a ground line 102 through a resistor 130.

In the driver circuit of this embodiment as well, when the MOSFETs 105 and 106 are in an OFF state, the body voltage is equal to the source voltage. In an ON state, a forward bias state is set. The absolute value of the threshold voltage decreases to result in an increase in drain current. However, unlike the first embodiment, even when the p-n junction formed by the body and the source is largely forward-biased, the current has a function of charging/discharging the output terminal, so no problem is posed. As a result, for this driver circuit, the power supply voltage need not be limited.

Assuming that the threshold voltage of the MOSFET is set to ±0.5 [V], and the power supply voltage is set to 1.5 [V], the operation of this driver circuit will be described below in detail.

Assume that the voltage of an input terminal 103 is 0.0 [V]. At this time, the voltage of the body terminal 112 of the MOSFET in an OFF state is 0.0 [V] through the resistor 130 and is in a high threshold state. On the other hand, the voltage of the body terminal 111 of the MOSFET 105 is 1.5 [V] corresponding to the power supply voltage through the resistor 129 and is in a high threshold state.

Assume that the voltage of the input terminal 103 changes from 0.0 [V] to 1.5 [V]. The body terminal 112 of the MOSFET 106 which should be turned on is charged through the MOSFET 108 in an ON state, and the voltage increases. A low threshold state is set to obtain a large driving current.

At this time, the p-n junction formed by the body and the source may be largely forward-biased. However, this current has a function of discharging the output terminal, as described above, and contributes to the high-speed operation, so no problem is posed. Upon completion of the discharge operation, the voltage of the body terminal 112 becomes 0.0 [V] through the MOSFET 108 or the resistor 130, and a high threshold state is set.

On the other hand, the voltage of the body terminal 111 of the MOSFET 105 which should be turned off remains 1.5 [V] because the MOSFET 107 is in an OFF state, and the voltage of the body terminal 111 is in a high threshold state. Assume that the voltage of the input terminal 103 changes from 1.5 [V] to 0.0 [V]. The body terminal 111 of the MOSFET 105 which should be turned on is discharged through the MOSFET 107 in an ON state, and the voltage decreases. A low threshold state is set to obtain a large driving current.

At this time, the p-n junction formed by the body and the source may be largely forward-biased. However, this current has a function of charging the output terminal, as described above, and contributes to the high-speed operation, so no problem is posed. Upon completion of the charge operation, the voltage of the body terminal 111 becomes 1.5 [V] through the MOSFET 107 or the resistor 129, and a high threshold state is set. On the other hand, the voltage of the body terminal 112 of the MOSFET 106 which should be turned off remains 0.0 [V] because the MOSFET 108 is in an OFF state, and the voltage of the body terminal 112 is in a high threshold state.

Since the MOSFETs 107 and 108 only charge/discharge the bodies of the MOSFETs 105 and 106, no large channel width is required. The bodies may be biased to a predetermined voltage or set in a floating state.

Figure 3B:
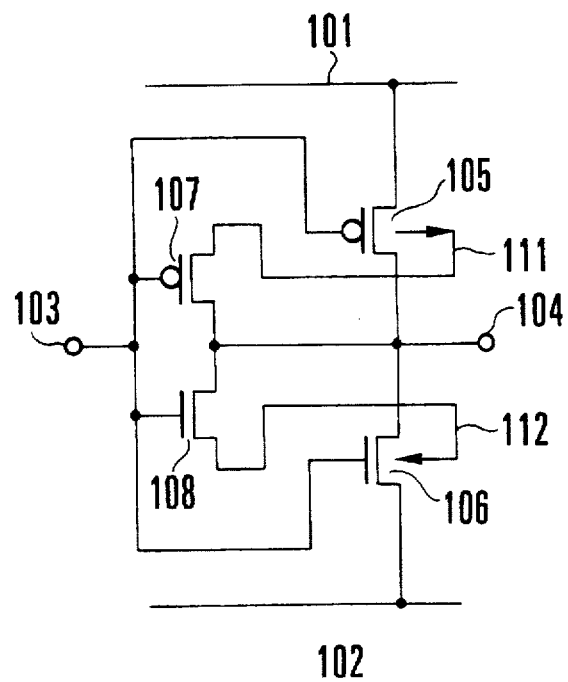
FIG. 3B is a circuit diagram showing a modification of the driver circuit shown in FIG. 3A.

The resistor 129 is an element for quickly setting the voltage of the body terminal 111 of the MOSFET 105 at the power supply voltage upon completion of the charge operation and setting a high threshold state. Similarly, the resistor 130 is an element for quickly setting the voltage of the body terminal 112 of the MOSFET 106 to the ground voltage upon completion of the discharge operation and setting a high threshold state. However, this function can also be provided by the MOSFETs 107 and 108. Therefore, even when the resistors 129 and 130 are omitted, as shown in FIG. 3B, no problem occurs in the operation.

To realize the above-described buffer circuit, a voltage must be independently applied to the bodies of the MOSFETs. For this purpose, the SOI technology is more suitable as a device technology than the bulk technology. In a bulk structure, wells must be individually formed in the MOSFETs, resulting in a large decrease in efficiency associated with the area.

Figure 4A:
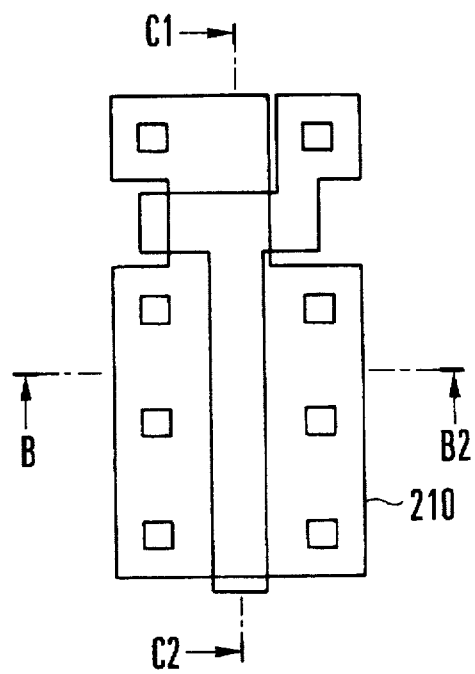
Figure 4B:
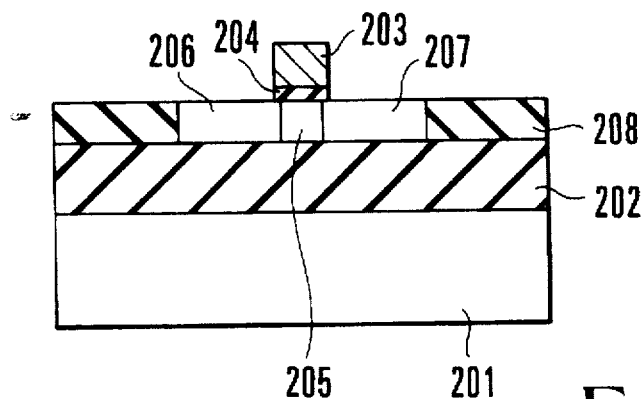
Figure 4C:
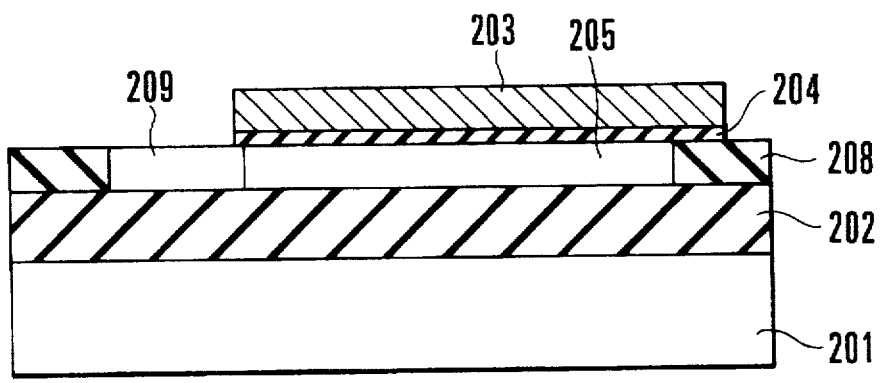
Figure 5:
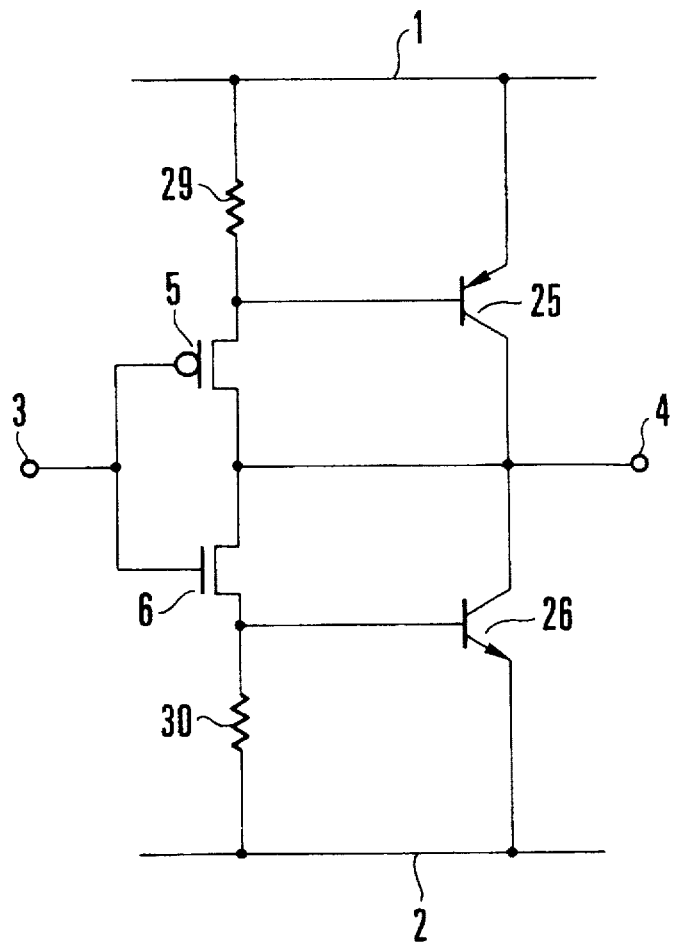
FIG. 5 is a circuit diagram of a conventional driver circuit.

FIGS. 4A to 4C show an n-channel MOSFET formed by the SOI technology, in which FIG. 4A shows a plan view, FIG. 4B shows a sectional view taken along a line B1–B2 in FIG. 4A, and FIG. 4C shows a sectional view taken along a line C1–C2 in FIG. 4A.

As shown in FIGS. 4B and 4C, an insulating film 202 is formed on a silicon (Si) substrate 201. In addition, an insulating film 208, an n-type source region 206, an n-type drain region 207, and a p-type body region 205 are formed on the resultant structure. A gate insulating film 204 is formed on the p-type body region 205, and a gate electrode 203 is formed on the gate insulating film 204.

Referring to FIG. 4C, a p-type body terminal region 209 having a higher impurity (e.g., boron) concentration than that of the body region 205 is formed at the end portion of the body region 205. In the first and second embodiments, the high threshold state and the low threshold state are realized by changing the voltage applied to this region 209.

In FIG. 4A, reference numeral 210 denotes a boundary between an active region and a field region.

Referring back to FIG. 2, when the forward bias voltage Vb between the source and the body is 0.0 [V] (Vb0), the threshold voltage is about 0.5 [V]. When the bias voltage Vb of 0.5 [V] is applied (Vb5), the threshold voltage is lowered by about 0.25 [V]. When the power supply voltage is 1.0 [V], the ON current increases by about 2.0 times.

It is possible to obtain a large ON-state current by simply designing a MOSFET with a low threshold voltage. In this case, the subthreshold current in an OFF state of the MOSFET increases, resulting in an increase in power consumption in an OFF state of the circuit. For example, when the threshold voltage is lowered by 0.25 [V], this current (i.e., power consumption) increases by about 1,000 times. A p-channel MOSFET also has the same problem.

The buffer circuit of the present invention uses a fact that the MOSFET can be set in a high or low threshold state by controlling the body voltage. With this arrangement, in a switching state (in an ON state), a large ON-state current is realized in a low threshold state. In an OFF state, a low power consumption is realized in a high threshold state.

In addition, the voltage must be independently applied to the body terminals of the MOSFETs. When the SOI technology shown in FIGS. 4A to 4C is used, an overhead associated with the area can almost be eliminated, thereby realizing a decrease in area.

As a result, without increasing the power consumption in an OFF state, the operation speed can be increased by about 2.0 times at a power supply voltage of 1.0 [V], or by about 1.5 times at a power supply voltage of 2.0 [V].

As has been described above, according to the present invention, when the MOS transistor is in an ON state, a voltage for setting the transistor in a low threshold voltage state is applied to the body terminal. In an OFF state of the transistor, a voltage for setting the transistor in a high threshold voltage state is applied to the body terminal. With this arrangement, both a high-speed operation and a low power consumption can be realized particularly at a low power supply voltage.

What is claimed is:

1. A driver circuit comprising:

a pair of complementary MOS (CMOS) transistors connected in series between power supply voltage value and ground voltage value and configured to receive an input signal; and a pair of control transistors configured to receive said input signal and to change a threshold voltage state of each transistor of the pair of CMOS transistors by applying a plurality of voltages to body terminals of the pair of CMOS transistors depending upon an ON/OFF state of each transistor of the pair of CMOS transistors.

2. A driver circuit according to claim 1, wherein said pair of control transistors apply the plurality of voltages in accordance with a voltage value applied to gate terminals of said pair of CMOS transistors.

3. A driver circuit according to claim 1, wherein the plurality of voltages comprise a first and second voltage, and wherein when one of said pair of CMOS transistors is an n-channel transistor, the first voltage is an intermediate value between said supplied power supply voltage value and said ground voltage value, and the second voltage substantially is the same value as the supplied ground voltage value.

4. A driver circuit according to claim 1, wherein the plurality of voltages comprise a first and second voltage, and wherein when one of said pair of CMOS transistors is a p-channel transistor, the first voltage is an intermediate value between said power supply voltage value and said ground voltage value, and the second voltage is substantially the same value as the power supply voltage value.

5. A driver circuit according to claim 1, wherein said pair of control transistors have the same conductivity type as said pair of CMOS transistors; and at least one of the pair of control transistors further comprises, a source connected to said body terminal of one of the pair of CMOS transistors, a drain connected to a gate of said one of the pair of CMOS transistors, and a gate connected to a gate voltage, wherein said gate voltage turns ON said at least one of the pair of control transistors.

6. A driver circuit according to claim 1, wherein said pair of control transistors have the same conductivity type as said pair of CMOS transistors; and at least one of the pair of control transistors further comprises, a source connected to said body terminal of one of the pair of CMOS transistors, a drain connected to a drain of said one of the pair of CMOS transistors, and a gate connected to a gate of said one of the pair of CMOS transistors.

7. A driver circuit according to claim 1, wherein said pair of CMOS transistors and said pair of control transistors are formed by SOI technology.

8. A driver circuit comprising:

a first MOSFET of a first conductivity type;

a second MOSFET of a second conductivity type connected in series to said first MOSFET, said first and second MOSFETs each having a gate terminal configured to receive an input signal;

a first control transistor configured to apply a first voltage to a body terminal of said first MOSFET in an ON state in order to hold said first MOSFET in a low threshold voltage state, and configured to apply a second voltage to said body terminal of said first MOSFET in an OFF state in order to hold said first MOSFET in a high threshold voltage state; and a second control transistor configured to apply the first voltage to a body terminal of said second MOSFET in an ON state in order to hold said second MOSFET in the low threshold voltage state, and configured to apply a third voltage to said body terminal of said second MOSFET in an OFF state in order to hold said second MOSFET in the high threshold voltage state;

wherein said first and second control transistors perform a complementary operation in accordance with the input signal.

9. A driver circuit according to claim 8, wherein said first control transistor alternately applies the first and second voltages to said body terminal of said first MOSFET in accordance with the input signal applied to said gate terminal of said first MOSFET; and wherein said second control transistor alternately applies the first and third voltages to said body terminal of said second MOSFET in accordance with the input signal applied to said gate terminal of said second MOSFET.

10. A driver circuit according to claim 8, wherein said first control transistor is constituted by a third MOSFET of the first conductivity type, and said first control transistor further comprises a source connected to said body terminal of said first MOSFET, a drain connected to said gate terminal of said first MOSFET, and a gate to which a first gate voltage turning on said first control transistor, is applied; and wherein said second control transistor is constituted by a fourth MOSFET of the second conductivity type, and said second control transistor further comprises a source connected to said body terminal of said second MOSFET, a drain connected to said gate terminal of said second MOSFET, and a gate to which a second gate voltage turning on said second control transistor, is applied.

11. A driver circuit comprising:

a first MOSFET of a first conductivity type;

a second MOSFET of a second conductivity type connected in series to said first MOSFET, said first and second MOSFETs each having a sate terminal configured to receive an input signal;

a first control transistor configured to apply a first voltage to a body terminal of said first MOSFET in an ON state in order to hold said first MOSFET in a low threshold voltage state, and configured to apply a second voltage to said body terminal of said first MOSFET in an OFF state in order to hold said first MOSFET in a high threshold voltage state; and a second control transistor configured to apply the first voltage to a body terminal of said second MOSFET in an ON state in order to hold said second MOSFET in the low threshold voltage state, and configured to apply a third voltage to said body terminal of said second MOSFET in an OFF state in order to hold said second MOSFET in the high threshold voltage state;

wherein said first and second control transistors perform a complementary operation in accordance with the input signal;

wherein said first control transistor is constituted by a third MOSFET of the first conductivity type, and said first control transistor further comprises a source connected to said body terminal of said first MOSFET, a drain connected to a drain terminal of said first MOSFET, and a gate connected to said gate terminal of said first MOSFET; and wherein and said second control transistor is constituted by a fourth MOSFET of the second conductivity type, and said second control transistor further comprises a source connected to said body terminal of said second MOSFET, a drain connected to a drain terminal of said second MOSFET, and a gate connected to said gate terminal of said second MOSFET.

* * * * *